US010393793B1

(12) United States Patent
Nguyen et al.

(10) Patent No.: US 10,393,793 B1
(45) Date of Patent: Aug. 27, 2019

(54) DETECTING POWER DISTURBANCES BASED ON NETWORKED POWER METERS

(71) Applicant: Amazon Technologies, Inc., Seattle, WA (US)

(72) Inventors: Huyen Van Nguyen, Bothell, WA (US); Michael P. Czamara, Seattle, WA (US); Osvaldo P. Morales, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 623 days.

(21) Appl. No.: 14/939,085

(22) Filed: Nov. 12, 2015

(51) Int. Cl.
*G01R 31/08* (2006.01)
*G01R 31/40* (2014.01)

(52) U.S. Cl.
CPC .......... *G01R 31/088* (2013.01); *G01R 31/40* (2013.01)

(58) Field of Classification Search
None
See application file for complete search history.

(56) References Cited

U.S. PATENT DOCUMENTS

| | | | | |
|---|---|---|---|---|
| 6,160,993 A * | 12/2000 | Wilson | ............... | H04B 7/18576 455/12.1 |
| 9,231,540 B2 * | 1/2016 | Cavallaro | ............... | H03F 1/308 |
| 9,342,414 B1 * | 5/2016 | Nguyen | ............... | G06F 11/2015 |
| 9,720,476 B1 * | 8/2017 | Nguyen | ............... | G06F 1/266 |
| 2010/0005331 A1 * | 1/2010 | Somasundaram | ........ | G06F 1/28 713/340 |
| 2012/0117392 A1 * | 5/2012 | Turicchi, Jr. | ............ | G06F 1/263 713/300 |
| 2015/0074431 A1 * | 3/2015 | Nguyen | ................... | H02J 3/006 713/300 |
| 2016/0330132 A1 * | 11/2016 | Rickey | ..................... | G06F 16/86 |
| 2017/0294778 A1 * | 10/2017 | Nguyen | ................... | H02J 3/006 |
| 2018/0138740 A1 * | 5/2018 | Churnock | ............... | H02J 9/061 |
| 2018/0270125 A1 * | 9/2018 | Jain | ..................... | H04L 41/5041 |

OTHER PUBLICATIONS

Xiaomin Bai in Transmission Analysis by Nash Game Method, IEEE Transactions on Power Systems, vol. 12, No. 3, Aug. 1997, p. 1046-1052.*

Sibonelo Motepe in Determining distribution power system loading measurements accuracy using fuzzy logic, Jan. 23-25, 2017, 5 pages.*

Data center networking explained, printed Apr. 30, 2019, 6 pages.*

(Continued)

*Primary Examiner* — Tung S Lau
(74) *Attorney, Agent, or Firm* — Kilpatrick Townsend & Stockton LLP

(57) ABSTRACT

Techniques for detecting a cause or a location associated with a power disturbance affecting a power distribution system are described. For example, an indication of such a power disturbance may be received from a power meter of the power distribution system. Power-related data may also be received from another power meter of the power distribution system based on the indication of the power disturbance. A cause or a location associated with the power disturbance may be determined based on the power-related data received from the other power meter.

19 Claims, 10 Drawing Sheets

(56) References Cited

OTHER PUBLICATIONS

Patel, Bhavesh. Web-Based Transient Detection Can Enhance Data Center Electrical System. [online] Data Center Knowledge, May 13, 2015 [retrieved on Oct. 20, 2015]. Retrieved from the Internet: <URL: http://www.datacenterknowledge.com/archives/2015/05/13/web-based-transient-detection-can-enhance-data-center-electrical-system/>, 2 pages.
Transient Detection System. [online] Emerson Network Power, Feb. 13, 2015 [retrieved on Oct. 15, 2015]. Retrieved from the Internet: <URL: https://www.youtube.com/watch?v=xpG8o4kI8EY&feature=youtu.be>, 6 pages.

* cited by examiner

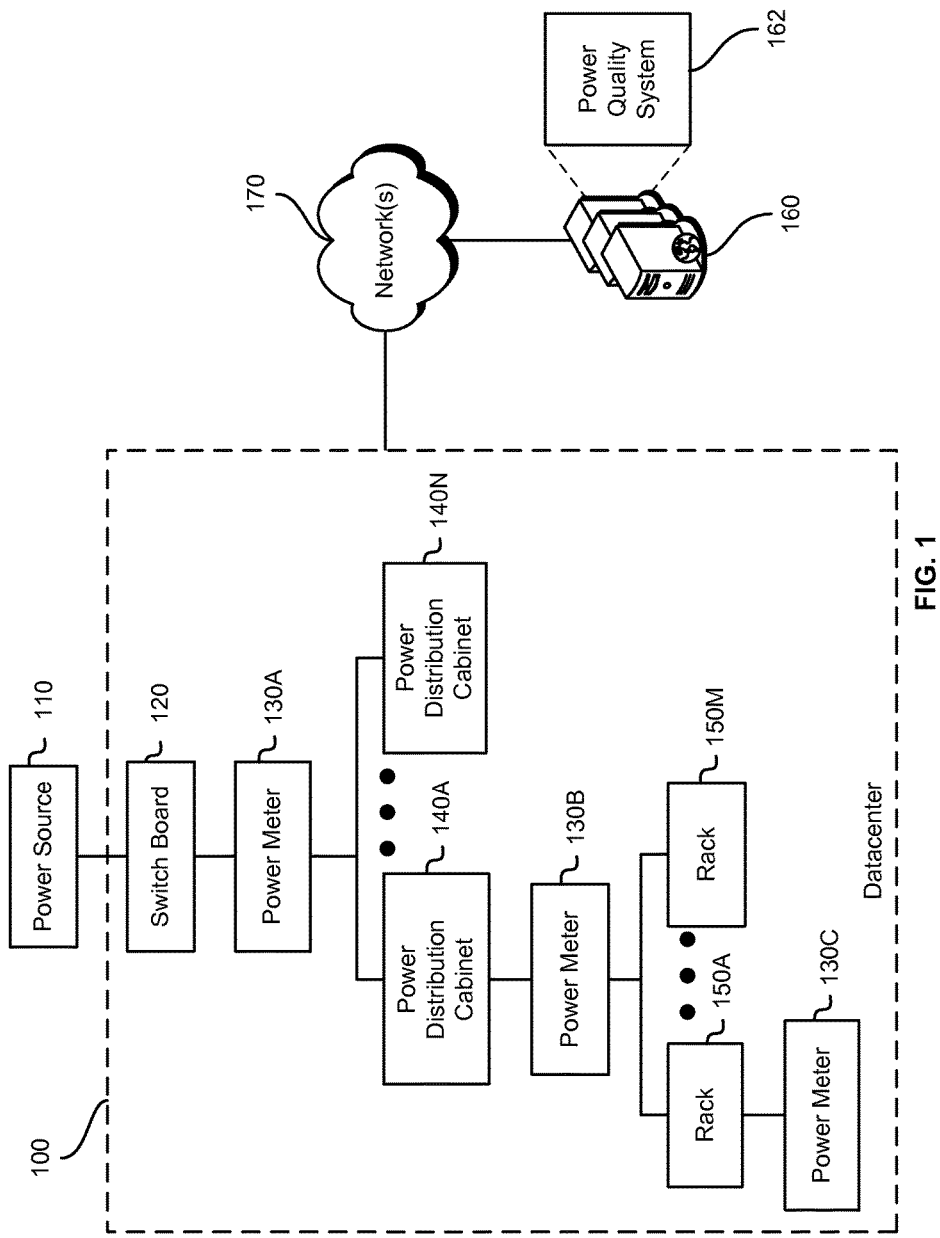

DETECTING POWER DISTURBANCES BASED ON NETWORKED POWER METERS

BACKGROUND

A datacenter represents a facility that houses a collection of computer servers and associated components, typically network hardware. The collection of computer servers is often called a "server cluster" or "server farm," and is designed to accomplish server needs beyond the capability of a single machine. Server farms are commonly used for cluster computing, web services, remote data storage, web hosting, and other web services. Server farms are increasingly being used by enterprises instead of, or in addition to, mainframe computers.

In a typical datacenter, the computer servers and network hardware are installed in racks. Power to the racks is provided through a power distribution system. The power distribution system may experience different types of power disturbance impacting power quality. Some of the power disturbances may result in faults and equipment failures. In various scenarios, detecting, troubleshooting, and/or planning for power disturbances may ease the risk of faults and failures.

BRIEF DESCRIPTION OF THE DRAWINGS

Various embodiments in accordance with the present disclosure will be described with reference to the drawings, in which:

FIG. 1 is a block diagram of an illustrative datacenter environment including a power distribution system in accordance with embodiments;

DETAILED DESCRIPTION

Figure 2A:
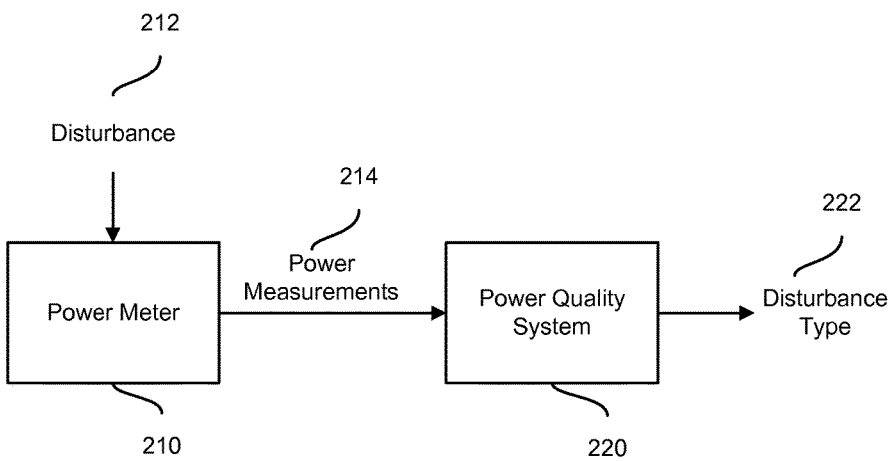
FIGS. 2A and 2B are block diagrams of illustrative communications between components of a power distribution to report power disturbances in accordance with embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments of the present disclosure are directed to, among other things, detecting power disturbances in a power distribution system of, for example, a datacenter. Various causes may result in power disturbances and may have different impacts to power quality within a section or the entire datacenter. Some of the causes may be internal to the datacenter. Other causes may be external. Detecting the causes and the respective locations may facilitate taking corrective actions. The corrective actions may, immediately or within a relatively acceptable timeframe, alleviate the impacts to the power quality. By also monitoring the causes and the corrective actions over time, the risks to the power quality may be mitigated and/or the impacts of the power disturbances may be protected against altogether. To do so, a number of power meters may be installed at different locations of the power distribution system. The power meters may be connected to a power quality system over a network. Upon detection of a power disturbance, an associated power meter may report data about the power disturbance to the power quality system. In turn, the power quality system may analyze the data to detect the cause of the power disturbance and the location of the cause. The power quality system may accordingly initiate a corrective action for implementation. Further, the power quality system may collect power disturbance data from the power meters over time. This data may be analyzed to generate a power disturbance profile of the distribution system. The power disturbance profile may be used to identify causes of power disturbances when occurring and to implement corrective actions. In a way, the power quality system may use the power disturbance profile to refine the analysis of the power disturbance. For example, upon receiving an indication of a power disturbance from one power meter, the power quality system may use the power disturbance profile to identify another power meter. The power quality system may request the other power meter to report its power-related data. Based on the reported data, the power quality system may determine the cause and location of the power disturbance and may initiate a corrective action. The power disturbance profile may also be used to forecast potential power disturbances and update power settings of the power distribution system to protect against such potentials, thereby shielding the power distribution system against the power disturbances and improving the overall power quality.

To illustrate, consider a basic example of a server receiving power from a feed of a power utility through a switch board. In this example, a first power meter may be installed between the server and the switch board and a second power meter may be installed between the switch board and the power utility feed. In addition, a power quality system may be implemented as a computing service on the server, on a different standalone server, or on a virtual server. The two power meters may interface with the power quality system over a network, such as a private or public TCP/IP-based network. Upon a power disturbance downstream from the switch board (e.g., an interruption because of a relay failure within the switch board), the first power meter may transmit data about the disturbance to the power quality system. Based on this data and the location of the first power meter, the power quality system may determine that a power interruption is occurring. The power quality system may ping the second power meter to receive power data. If the second power meter reports a normal power state, the power quality system may determine that the power interruption is local to the switch board. Based on a history of prior local interruptions accessible from a power disturbance profile, the power quality system may determine that a particular component within the switch board (e.g., the relay) may be behind the power interruption. Accordingly, the power quality system may generate instructions to change a power setting of that particular component.

In the interest of clarity of explanation, embodiments may be described herein in connection with a power distribution system of a datacenter. However, the embodiments are not limited as such. Instead, the embodiments may similarly apply to other power distribution systems. These systems may be associated with critical operations of a facility such as a power distribution system of a power utility, a hospital, or an airplane. Other power distribution systems may be non-critical and may include, for example, an entertainment system installed at a premise. Generally, a power distribution system may include a number of components to distribute power from one or more sources to one or more power loads.

Turning to FIG. 1, the figure illustrates an example of a power distribution system of a datacenter 100. The datacenter 100 may include computer servers and network hardware that may be installed in racks. Power to the racks may be provided through the power distribution system. In particular, the power distribution system may be configured to provide power from one or more sources to the racks.

As illustrated, a power source 110 may provide power to the datacenter 100 or to a section thereof. In an example, the power source 110 may be external to the datacenter 100 and may represent a feed of a power utility through a public grid. In another example, the power source 110 may be managed by a service provider of the datacenter 100 and may be external or internal to the datacenter 100. For instance, the power source may represent a feed from a local power generation source or from a battery backup system such as an uninterruptible power supply (UPS) system. In addition, more than one power source may be used (not shown in FIG. 1) for redundancy and load balancing purposes.

The power source 110 may feed power to a pod of racks 150A-M within the datacenter 100. The size of a pod may vary between, for example, two hundred fifty to three hundred fifty racks. To distribute power to a pod, the power distribution system may include a switch board 120, a plurality of power distribution cabinets 140A-N, in addition to wiring and other power distribution hardware. The switch board 120 may represent an interface between the power source 110 and components of the datacenter 100 such that power may be properly fed to the datacenter 100. For example, the switch board 120 may include a set of transformers, switches, relays, and other interface components. In comparison, each of the power distribution cabinets 140A-N may be configured to receive power from the power source 110 (or from multiple power sources for redundancy) through the switch board 120 and to distribute the power to a number of racks.

In an example, the power distribution cabinet 140A may distribute power to a plurality of racks 150A-M. The power distribution cabinet 140A may include a number of transfer switches, each of which may selectively choose between the power source 110 and a backup power source. In an example, the transfer switches may be configured to draw power from power source 110 and to switch to the backup power source based on various factors. The factors may relate to power disturbances and power quality degradation including, for example, transients, interruptions, sags, swells, distortions, and/or fluctuations. In an example, the power distribution cabinet 140A and the transfer switches may represent an automatic transfer switch cabinet (ATSC) and automatic transfer switches (ATS's), respectively.

Each of the racks 150A-M may include various computing equipment, such as computer servers and network hardware. The power consumption across the racks 150A-M may vary. For example, each of the racks 150A-M may be rated at any of 5, 10, 15 or 20 KVA. Further, each rack may receive power on multiple phases to help against potential disturbances on a single phase.

The power distribution system may also include a number of power meters 130A-C. The power meters 130A-C may be installed and distributed across the datacenter 100. As illustrated, the power meter 130A may be located between the switch board 120 and the power distribution cabinets 140A-N. Similarly, the power meter 130B may be located between the power distribution cabinet 140A and the rack 150A. The power meter 130C may be located at an end of a power feed chain such as after the rack 150A. Although FIG. 1 illustrates the power meters 130A-C as being standalone components, some or all of these meters may be integrated with other components of the datacenter 100. For example, the power meter 130A may be integrated with the switch board 120.

Generally, each power meter may be configured to detect and report power disturbances occurring upstream from the power meter. For example, the power meter 130A may detect a power disturbance occurring at any point between the power source 110 and the power meter 130A. However, the power meter 130A may not detect a downstream power disturbance.

In an example, the power meters 130A-C may networked. For example, each power meter may support a number of network protocols and connectivity technologies, such as TCP/IP over WiFi. The power meters 130A-C may be configured to communicate between themselves, such as through point-to-point, unicast, multicast, push, pull or other types of communication. These communications may also be managed through a master-slave configuration. In addition, the power meters 130A-C may communicate with systems and components internal and external to the datacenter 100 over one or more networks. For example, the power meters 130A-B may communicate with a server 160 hosting a power quality system 162 over a network 170. This communication may be web-based and/or may use an application programming interface (API). Generally, the communications between the power meters 130A-C and with the other components may include data associated with power disturbances as further described in the next figures.

The network 170 may include any one or a combination of many different types of networks that may support various communication protocols, such as cable networks, the Internet, wireless networks, cellular networks, and other private and/or public networks. As illustrated, the network 170 may be partially or fully external to the datacenter 100. However, in another example, the network 170 may be internal to the datacenter 100

In an example, the server 160 may be a standalone server managed by a same or a different service provider than that of the datacenter 100. In another example, the datacenter 100 may include the server 160 such as one of the equipment in the racks. In yet another example, the server 160 may represent a set of virtual computing resources hosted on a computing cloud. In turn, the computing cloud may be provided by the datacenter 100 or by a different datacenter.

The power quality system 162 may be implemented as a computing service that may provide different services associated with the quality of the power through the power distribution system of the datacenter 100. In an example, the power quality system 162 may be configured to receive power-related data from the power meters 130A-C, analyze such data, and provide the different services. For example, the power quality system 162 may detect types of power disturbances, causes of the power disturbances, locations of the causes, and may generate corrective actions accordingly. The corrective actions may facilitate responding to the power disturbances, by, for example, adjusting power settings of impacted components of the datacenter 100. The corrective actions may also facilitate planning for protections against potential power disturbances.

In addition, the power quality system 162 may provide reports and alerts (e.g., audible and/or visual notifications and messages on user interfaces) such that a service provider of the datacenter 100 may monitor the power quality in real time. By identifying causes and locations of power disturbances and corrective actions, the service provider may improve the power quality and/or the protection against power disturbances over time. These and other characteristics of the power quality system 162 are further illustrated in the next figures.

Hence, the power distribution system of the datacenter 100 may be configured to distribute power to a plurality of racks. By using networked power meters and a power quality system, the power distribution system may monitor power quality conditions, report power disturbances, and facilitate corrective actions.

Although FIG. 1 illustrates that the power quality system 162 may analyze the power quality within the datacenter 100, the embodiments described herein may not be limited as such. Instead, the embodiments may similarly apply to a power quality system that may analyze the power quality of a plurality of datacenters and/or other systems distributed at different locations.

As described herein above, networked power meters may detect and report power disturbances to a power quality system. Different techniques may be implemented for such reporting as further illustrated in the next figures. Generally, the techniques may distribute the processing of power-related data between the power meters and the power quality system. Some of the techniques may alleviate the processing of the power meters relative to other techniques.

Figure 2B:
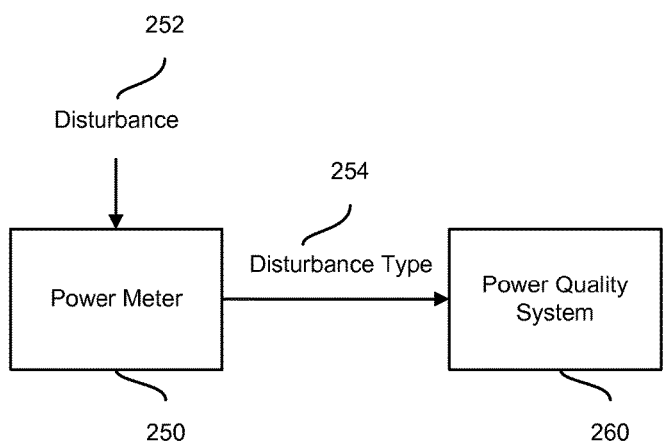

Turning to FIGS. 2A and 2B, examples of two techniques to detect a power disturbance are illustrated. FIG. 2A illustrates an example of a first technique. In this example, a power meter 210 may monitor power data, detect a disturbance 212, and report power measurements 214 of the disturbance 212 to a power quality system 220 over a network. In turn, the power quality system 220 may analyze the power measurements 214 to detect a type 22 of the disturbance 212. Under this technique, the power meter 210 may continuously monitor the power. Upon detection of a particular disturbance, the power measurements 214 may be recorded. In an example, the power measurements 214 may include a number of waveforms representative of the power disturbance 212. More generally, the power measurements 214 transmitted over the network may include analog or digital measurements represented in the time domain, frequency domain, or other domains. The power quality system 220 may analyze particular characteristics of the power measurements 214 (e.g., change in current or voltage, rate of change, particular signatures in waveforms, etc.) to detect the power disturbance type 222.

FIG. 2B illustrates an example of a second technique. In this example, a power meter 250 may monitor power data, detect a power disturbance 252, record the associated power measurements, analyze characteristics of the power measurements to identify a type 254 of the power disturbance 222, and report the type 254 to a power quality system 260. Reporting the disturbance type 254 may include transmitting an identifier of this type (e.g., a unique message or code unique to each power disturbance type, such as a message "PI" for a power interruption and "PS" for a power sag). In a further example, reporting the disturbance type 254 may also include some or all of the power measurements. As such and relative to the first technique, this second technique may push additional processing to the power meter but may reduce the network bandwidth usage for reporting data about a power disturbance. Conversely, the first technique may necessitate less processing at the power meter.

In an example, a power meter may implement any or a combination of the above techniques by way of hardware and/or software. For example, circuitry and/or logic specific to detecting and/or reporting a power disturbance event (e.g., data including the power measurements and/or the power disturbance type) may be implemented at the power meter.

In an example, a number of power disturbance types may be determined. Transients, interruptions, sags, swells, distortions, fluctuations, and/or other types of power disturbances may be analyzed. Different analysis techniques may be used. Generally, changes in current, changes in voltage, magnitude of change, rate of change, and other characteristics may be analyzed in the time domain, frequency domain, and/or other domains to identify the power disturbance type. Examples of such analysis techniques are provided herein next.

Transients may represent a sudden, short-lived power burst and may include impulsive and oscillatory power disturbances. To detect transients, voltage may be for example sampled at a particular sampling rate. Atypical changes in the voltage magnitude and/or duration of the changes (e.g., a sudden and short-lived increase) may indicate transients.

Interruptions may represent a loss of power. The loss may be instantaneous, momentary, temporary, or sustained depending on the duration of the loss. To detect interruptions, voltage may be for example sampled at a particular rate (e.g., depending on the type of the power interruptions to be detected). A drop in the voltage below a certain threshold (or a complete drop) may indicate an interruption. The duration of the drop may indicate the type of the interruption.

Sags may represent a momentary reduction in power below a certain threshold (e.g., ten percent of the nominal value or some other threshold) lasting for a certain duration (e.g., a half a cycle to a minute). To detect sags, voltage may be sampled at a particular rate. When the root mean square (RMS) of the voltage magnitude decreases below the threshold for the length of the duration, a power sag may be detected.

Swells may represent a momentary increase in power over a certain threshold (e.g., ten percent of the nominal value or some other threshold) lasting for a certain duration (e.g., a half a cycle to a minute). To detect swells, voltage may be sampled at a particular rate. When the root mean square (RMS) of the voltage magnitude increases over the threshold for the length of the duration, a power swell may be detected.

Distortions may include waveform distortions representing variations to a power quality that may, in turn, affect the wave shape of the power (e.g., of the voltage and/or the current). Different types of waveform distortions may exist, such as direct current offset, harmonic distortion, interharmonics, notching, and noise. Analysis techniques specific to each type of distortion may be used. For instance, to detect a harmonic distortion, the power of a fundamental frequency may be measured. Similarly, powers of harmonic components may be measured. A comparison (e.g., a ratio) of these powers to the one of the fundamental frequency may identify whether a harmonic distortion exists or not.

Fluctuations may represent a set of random changes in power (e.g., voltage or current) for a certain duration. To detect a fluctuation, voltage may be sampled. Changes in the voltage magnitude and the size, direction, and/or rate of the changes may indicate a power fluctuation.

Different causes may be behind the power disturbances. Generally, the causes may be internal or external to the datacenter 100. For example, the causes may relate to a power utility supplying the power to the datacenter 100, other clients or loads of the power utility, power supplies or power loads internal to the datacenter 100, and/or environmental conditions (e.g., lightning, power line cuts because of tree falls, etc.). Further, there may be a one-to-one, one-to-many, many-to-one, or many-to-many relationship between a cause(s) and a power disturbance type(s). As such, based on a power disturbance type, a power quality system may identify a cause of the power disturbance with a certain likelihood. In addition, based on a location(s) of a reporting meter(s), a location of the cause may be detected. The power quality system may collect over time data related to power disturbances, causes, and locations and may generate a profile of the power disturbance for the datacenter 100. This profile may refine the analysis of the power quality system. For example, the power quality system may determine with higher precision, accuracy, or resolution the power disturbance type, cause, and/or location.

To illustrate, the power quality system may detect, based on the profile, that the switch board 120 may be a likely cause (e.g., with a certain likelihood) behind a power distortion. Over time and as data is collected, the profile may be updated to indicate that, whenever a power distortion is observed, a particular transformer within the switch board 120 may be the culprit. As such, the power quality system may refine its subsequent analysis to identify the particular transformer with a higher likelihood as being the cause.

Figure 3A:
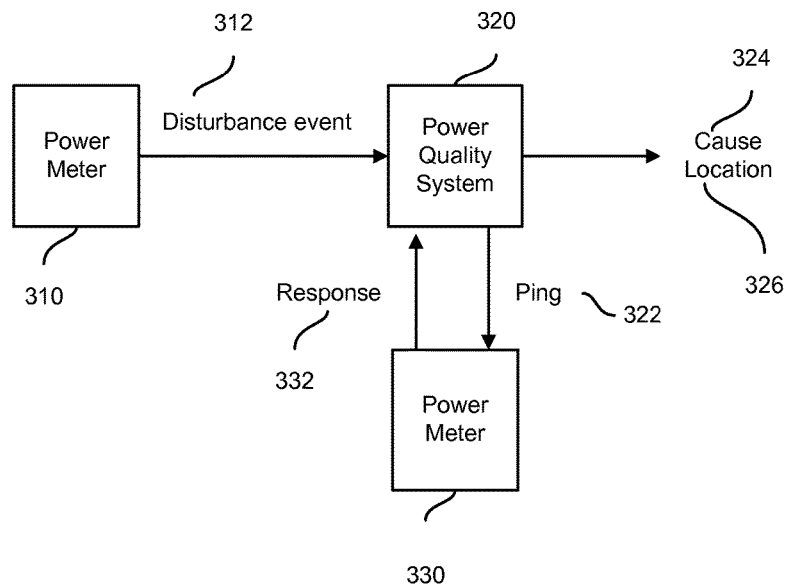
FIGS. 3A and 3B are block diagrams of illustrative communications between components of a power distribution to detect causes and locations of power disturbances in accordance with embodiments.
Figure 3B:
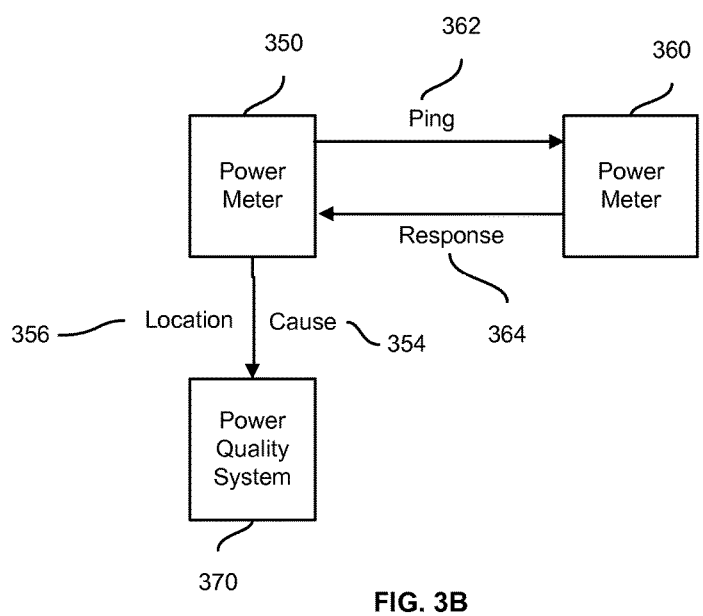

Turning to FIGS. 3A and 3B, the figures illustrate two example techniques for identifying a cause of a disturbance. The details of using a profile as a part of these techniques are omitted here and are further illustrated in the next figures in the interest of clarity of explanation.

FIG. 3A illustrates an example of a first technique. In this example, a power meter 310 may transmit a power disturbance event 312 to a power quality system 320 over a network. As explained in connection with FIGS. 2A and 2B, the power disturbance event may include power measurements and/or a type of a power disturbance. In either case, the power quality system 320 may determine, based on a profile and a topology of the power meters, a cause 324 of the power disturbance and a location 326 of the cause with a certain likelihood.

The topology may represent the network and/or physical locations of the power meters. For example, in IP-based communications, an IP address of the power meter 310 may be mapped to a physical location of the power meter 310 within the datacenter. The physical location may indicate or identify the power component of the datacenter 100 that the power meter 310 is associated with. The topology may store this mapping of IP addresses, physical locations, and associations with power components. The power quality system 320 may access the topology and look up the physical location of the power meter 310 based on the IP address. As explained in connection with FIG. 1, when the power meters are configured to detect upstream power disturbances, the physical location of the power meter 310 may facilitate identifying the upstream power components and thus narrow the potential causes. Based on the physical location, the power disturbance type and, optionally, the profile, the power quality system 320 may determine the cause 324 and the location 326 of the cause 324.

In an example, when the cause 324 and/or the location 326 are not determined with a sufficient resolution or precision, the power quality system 320 may collect power data from another power meter 330 and analyze this data to further refine the cause 324 and location 326 determination. The other power meter 330 may be determined from the topology based on, for instance, the physical location of the power meter 310 and/or the power disturbance type. For example, the other power meter 330 may be an immediately next upstream power meter (e.g., if the power meter 310 includes the power meter 130B of FIG. 1, the other power meter 330 would include the power meter 130A of FIG. 1), a distant upstream power meter, a downstream power meter, or a power meter at a same hierarchy level. Once determined, the power quality system 320 may ping 322 the other power meter 330 to return an up-to-date (e.g., real-time) power measurement or power disturbance state (e.g., whether no power disturbance is observed or a particular observed power distribution type). Based on the response 332 from the other power meter 330, the power quality system 320 may further refine its determination of the cause 324 and the location 326. For example, if the other power meter 330 is the immediately next upstream power meter and if the response indicates a normal power state, the power quality system may indicate that the power component between the two power meters 310 and 330 may be the cause 324. In an example, the process of pinging the power meters may be repeated across a number of power meters to refine the analysis. The pinging may include a general broadcast or a specific request to some of the power meters.

FIG. 3B illustrates an example of a second technique. In this example, some of the above analysis may be pushed to the power meters for processing thereat. For example, a power meter 350 may determine, based on an observed power disturbance, a cause 354 of the power disturbance and a location 356 of the cause 354. The cause 354 and the location 356 may be determined from a power disturbance event. In addition, the cause 354 and the location 356 may be determined based on the location (e.g., physical location) of the power meter 350, a power disturbance profile of the datacenter 100 and/or a topology of the power meters. In an example, the power meter 350 may also have remote access to the power disturbance profile and the topology over a network. In another example, the power disturbance profile and the topology may be stored locally on the power meter 350. Similarly to the above technique, depending on the likelihood of the cause 354 and the location 356, the power disturbance profile, and/or the topology, the power meter 350 may also ping 362 another power meter(s) 360 for a response 364 about the power state that the other power meter(s) 360 may be concurrently observing. The response 364 may allow the power meter 350 to refine the cause and location analysis. The other power meter(s) 360 may be identified based on the topology. Once determined, the power meter 350 may transmit data about the cause 354 and the location 356 to a power quality system 370.

Once a cause of a power disturbance and a location of the cause is detected, different corrective actions may be initiated. Some of the corrective actions may trigger an immediate correction to the power disturbance such that the impact to the power distribution in the datacenter 100 may be alleviated. For example, a corrective action may change a setting of a relay or switch the power feed to another power source. Other corrective actions may facilitate a long term plan for mitigating the risk of power disturbances. For example, a corrective action may include storing data about the power disturbance (e.g., the cause, the location, the type, the measurements, and/or an identifier(s) of the reporting power meter(s)). Over time, the stored data may be analyzed to generate a power disturbance profile of the datacenter 100 and implement design solutions to limit the impact of power disturbances.

Figure 4A:
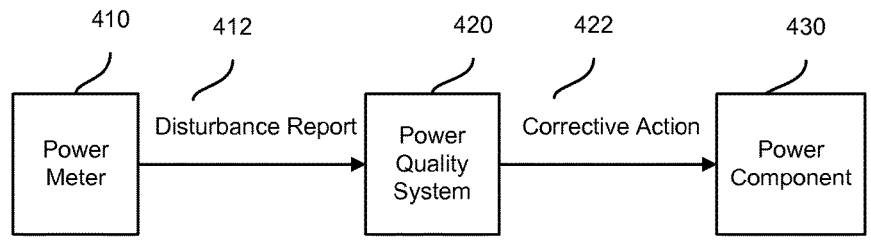
FIGS. 4A and 4B are block diagrams of illustrative communications between components of a power distribution system to implement corrective actions in response to power disturbances in accordance with embodiments.
Figure 4B:
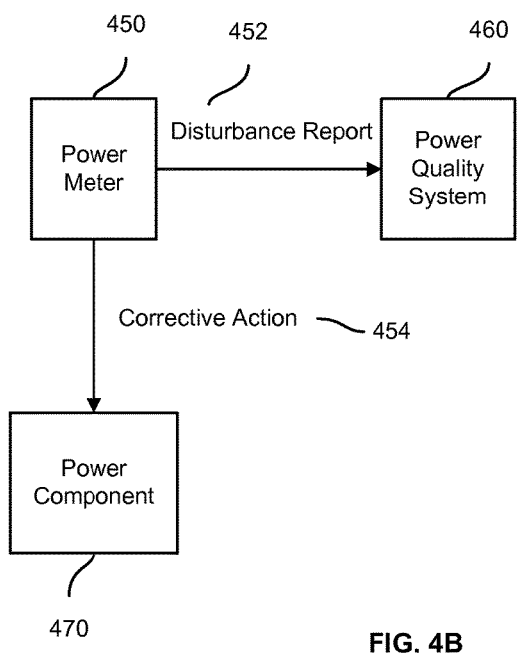

Turning to FIGS. 4A and 4B, the figures illustrate two example techniques for initiating corrective actions. The initiated corrective action may be based on the power disturbance profile and the topology of the datacenter 100. The details of using the power disturbance profile and the topology are omitted here and are further illustrated in the next figures in the interest of clarity of explanation.

FIG. 4A illustrates an example of a first technique. In this example, a power quality system 420 may initiate a corrective action 422 based on a disturbance report 412 received from a power meter 410. As described in connection with FIGS. 3A and 3B, the power meter 410 may report a disturbance event to the power quality system 420 which, in turn, may determine a cause of the power disturbance and a location of the cause. Additionally or alternatively, the power meter 410 may report the cause and the location. As such, the disturbance report 410 may include the disturbance event, cause, and/or the location.

In turn, the power quality system 420 may access the power disturbance profile of the datacenter 100. The power disturbance profile may list potential corrective actions. Based on the cause, the location, and/or the type of the power disturbance, the power quality system 420 may select the corrective action 422. In addition, the power quality system 420 may communicate with a power component 430 and/or the power meter 410 to implement the corrective action 422 and/or may generate an alert or notification about the corrective action 422 for presentation at a computing device of an operator.

To illustrate, the power quality system 420 may determine that a fault on a power feed from a particular power source may have caused a power distortion. Based on the power disturbance profile, the power quality system 420 may determine that the corrective action 422 includes switching the power feed to another power source. Accordingly, the power quality system 420 may cause a transfer switch (e.g., an example of the power component 430) to switch the power feed to the other power source.

FIG. 4B illustrates an example of a second technique. In this example, the identification and initiation of a corrective action may be pushed to a power meter rather than a power quality system. In particular, a power meter 450 may send a disturbance report 452 to a power quality system 460. This may allow the power quality system 460 to collect power disturbance-related data over time and to further refine the power disturbance profile of the datacenter 100. In addition, the power meter 450 may access, locally or remotely, the power disturbance profile to determine a corrective action 454. Once determined, the power meter 450 may initiate the corrective action 454. For example, the power meter 450 may instruct a power component 470 to implement the corrective action and/or may generate an alert or notification about the corrective action 454 for presentation at a computing device of an operator.

Figure 5:
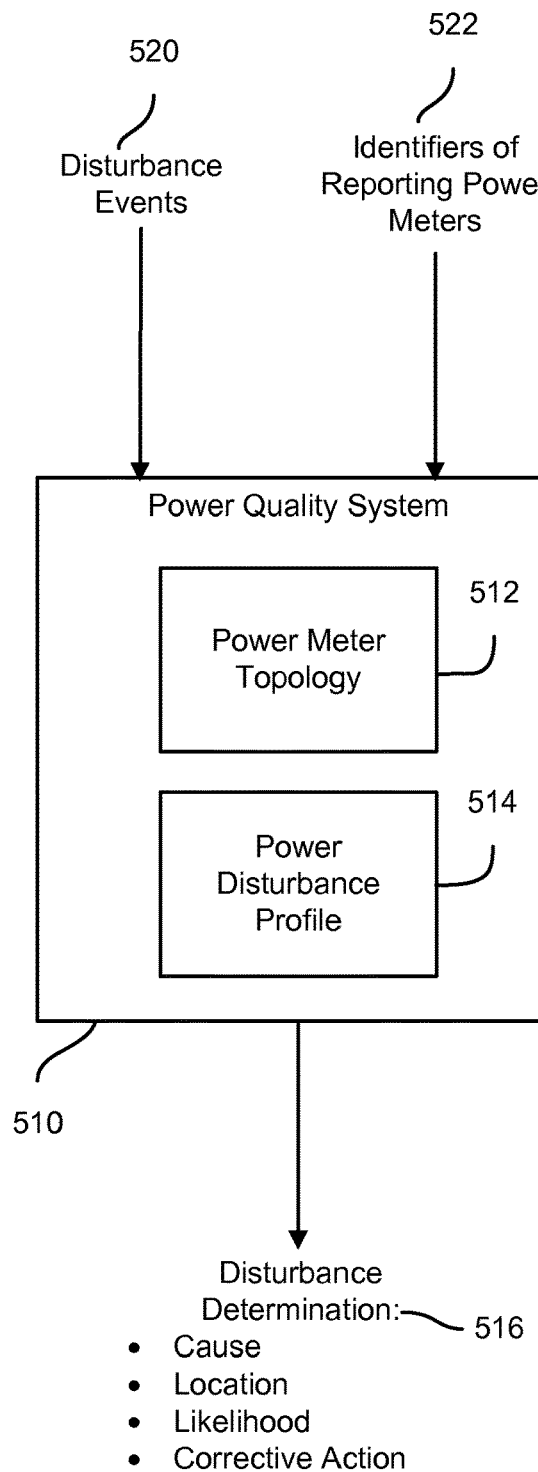
FIG. 5 is a block diagram of an illustrative set-up for determining a response to a power disturbance in accordance with embodiments.

Turning to FIG. 5, the figure illustrates an example power quality system 510 that may maintain a power meter topology 512 and a power disturbance profile 514 of the datacenter 100. The power quality system 510 may use the power meter topology 512 and/or the power disturbance profile 516 for analyzing power disturbance-related data of the datacenter 100 and output a disturbance determination 516. The power disturbance determination 516 may include a cause of a power disturbance, a location of the cause, a likelihood of the cause, and/or a corrective action.

In an example, the power meter topology 512 may include a mapping of logical addresses to physical addresses or physical locations of the power meters of the datacenter 100, associations of the power meters with the power components of the datacenter 100, hierarchy levels that the power meters belong to, and/or other data related to a topology of the power meters within the datacenter 100. For instance, the power meter topology 512 may identify a physical location of a power meter, the immediate upstream power component and the immediate downstream power component from the power meter, the hierarchy level that the power meter belongs to, and/or the other power meters in proximity of the physical location (e.g., at the same hierarchy level or associated with the upstream and downstream components).

In an example, the power disturbance profile 514 may represent a profile configured to facilitate a determination of causes and locations related to power disturbances within the datacenter 100. For instance, the power disturbance profile 514 may include correlations between power disturbance types, identifiers of power meters reporting power disturbances, and the causes and locations. Optionally, the power disturbance profile 514 may also include response logic for responding to reported data about a power disturbance. The response logic may, for instance, define a corrective action to initiate, whether to ping a set of power meters based on the reported data, and/or what set of power meters to ping.

To illustrate, the power disturbance profile 514 may indicate that, for example, if a particular power meter reports a power distortion, the cause of this distortion may be an immediate upstream power component. A corrective action may be to adjust the power settings of such a component. However, if the particular power meter reports a power interruption, the cause of this distortion may be the immediate upstream power component or a power component at a higher hierarchy level. In such a case, the power disturbance profile 514 may indicate that a power meter at the higher hierarchy level should be pinged and depending on the response thereof, the cause may be the immediate upstream power component or the other power component. This power meter may be identified from the power meter topology 512.

Although illustrated as two separate components in FIG. 5, the power meter topology 512 and the power disturbance profile 514 may also be integrated. For example, the power disturbance profile 514 may include the power meter topology 512.

To generate the power meter topology 512, data about the various locations and associations may be inputted at an interface of the power quality system 510. An operator may input such data. In another example, some portion or all of the data stored in the power meter topology 512 may have been generated by a discovery process that may be independent or may supplement the operator input. For example, the power quality system 512 may learn the logical and physical locations of the power meters and the associations with power components through communications with such power meters and/or power components.

In an example, the power disturbance profile 514 may be generated and/or edited based on input of the operator. In another example, other processes may be additionally or alternatively used such as machine learning algorithms and/or other analysis techniques. Such processes may analyze historical data related to power disturbances within the datacenter 100 (or within other datacenters such as ones having a similar topology and/or similar power components). For instance, data related to power disturbances may be tracked over time. This data may include power disturbance events 520 (e.g., power measurements, disturbance types), identifiers 522 of reporting power meters, locations of such power meters, pings and responses by other power meters to a power disturbance detected at a particular power meter, causes, locations, corrective actions initiated, successes and failures of the corrective actions, reporting history of each power meter (e.g., past power disturbances reported per power meter and resulting causes, locations, and corrective actions), time periods of power disturbances, time periods of corrective actions, and/or other data related to measuring, detecting, and resolving power disturbances. A machine learning algorithm, such as one utilizing support vector machines (SVMs) or a random forest algorithm, may analyze the data to recognize patterns and accordingly generate the power disturbance profile 514.

To illustrate, based on the analysis of the collected data, the power disturbance profile 514 may list various parameters associated with detecting a power disturbance, identifying the cause and location, and initiating a corrective action. For example, the power disturbance profile 514 may list the different potential types of power disturbances (e.g., transients, interruptions, sags, swells, distortions, and fluctuations). For each type, the power disturbance profile 514 may identify a range of acceptable power values. The ranges may be defined in time domain, frequency domains, and/or other domains. If a measured power has a value outside a particular range, the power disturbance profile 514 may identify the corresponding power disturbance type as one of the listed types. In addition, the power disturbance profile 514 may list potential causes, locations, and associated likelihoods per power disturbance type. Each cause, location, and likelihood may depend on the set of power meters reporting the power disturbance type. For instance, a power disturbance type reported by only one power meter may correspond to particular cause and location at a particular likelihood. In comparison, the same power disturbance type reported by multiple power meters may correspond to another cause and location at another likelihood. Such associations between causes, locations, likelihoods and sets of reporting power meters may also be defined in the power disturbance profile 514. Further, the power disturbance profile 514 may specify corrective actions that may be initiated. A corrective action may be specified per power disturbance type, cause, location, and likelihood. Further, the power disturbance profile 514 may also define a time dimension for the different disturbance types, causes, locations, likelihoods, and corrective actions. For instance, if a particular disturbance type is observed within a time period, the power disturbance profile 514 may identify one cause and one corrective action. However, if that same particular disturbance type is observed within another time period, the power disturbance profile 514 may identify a different cause and corrective action.

Figure 6:
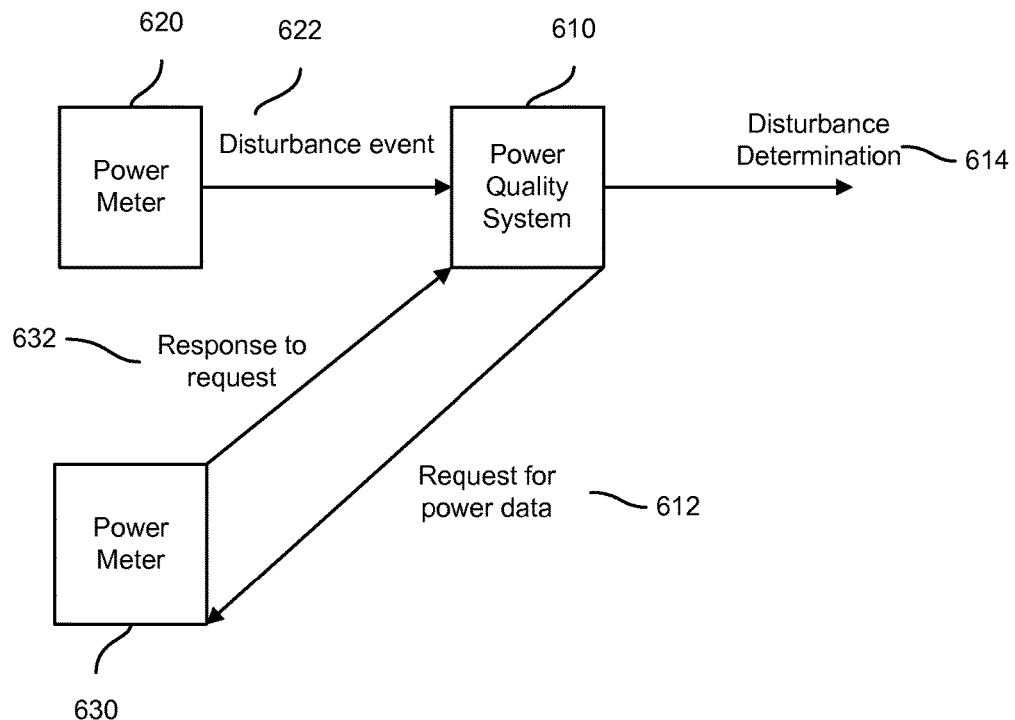
FIG. 6 is a block diagram of an illustrative set-up for determining a power disturbance based on multiple power meters in accordance with embodiments.

As described herein above, a power quality system may use a power distribution profile and power meter topology to determine a cause and a location related to a power disturbance. In an example, the determination may be based on communication of the power quality system with a single power meter. In another example, the determination may involve multiple power meters. Generally, communicating with multiple power meters may refine the determination by allowing to more accurately (or with a higher confidence level) identify the cause and the location. FIG. 6 illustrates an example of using multiple power meters.

In the interest of clarity of explanation, FIG. 6 illustrates using two power meters. However, the embodiments of the present disclosure may not be limited as such. Instead, the embodiments may similarly apply to a larger number of power meters. Generally, the power quality system may determine what power meters to involve based on the power disturbance type, the reporting power meter, the power distribution profile, and the power meter topology. For instance, the power quality system may provide the power disturbance type and an identifier of the reporting power meter as input to the power distribution profile to determine whether and what other power meters should be pinged. The power meter topology may identify such power meters (e.g., identify the corresponding IP addresses of the power meters within a computer network that is connected to the meters).

In the illustrated example, the power quality system 610 may receive a disturbance event 622 from a first power meter 620. The power quality system 610 may identify a power disturbance type based on the disturbance event 622. Based on a first identifier of the first power meter 620 and the power disturbance type, the power quality system 610 may determine from the power disturbance profile and the power meter topology that a second power meter 630 should be pinged to detect the cause and the location related to the power disturbance. Accordingly, the power quality system may send a request 612 for power data to the second power meter 630. The requested power data may include, for example, a power state of the second power meter 630 (e.g., whether a power disturbance is currently observed or not, power disturbance type as applicable, power measurements, etc.).

In turn, the second power meter 630 may send a response 632 to the request 612. The response may include, for example, the requested power data. The power quality system 610 may receive the response 632. Based on the disturbance event 622 (e.g., the power disturbance type) received from the first power meter 620 and based on the response 632 received from the second power meter 630, the power quality system 610 may generate a disturbance determination 614 (e.g., cause, location, likelihood, and corrective action). For example, the power quality system 610 may analyze the response 632 to determine if the power disturbance type may have been observed at the second power meter 630 or not. The power quality system 610 may provide two inputs to the power disturbance profile. The first input may include the power disturbance type observed by the first power meter 620. The second input may include whether that power disturbance type may have also been observed by the second power meter 630. Based on the two inputs, the power quality system 610 may output the disturbance determination 614 from the power disturbance profile.

To illustrate, consider an example of a power distortion. The first power meter 620 may report the power distortion to the power quality system 610. In turn, the power quality system 610 may ping the second power meter 630 to identify whether the second power meter 630 may also be observing the power distortion. In this example, the two power meters may be at same hierarchy levels but associated with different power components. If the second power meter 630 indicates that the power distortion is also observed, the power quality system 610 may determine that a cause of the power distortion may be a power component located at a higher hierarchy level, for example, a power component located between the higher hierarchy level and the power utility. However, if the second power meter 630 indicates that the power distortion is not observed, the power quality system 610 may determine that the power component associated with the first power meter 620 may be the cause.

The above example is provided for illustrative purposes. Different types of pings (e.g., the request 612) may be used. For example, rather than requesting the second power meter 630 to confirm if the same power disturbance type may have been observed, the ping may request the power state. This power state may indicate the same or other power disturbance types, if any. In addition the pings may, but need not, be used. For example, the second power meter 630 may send the power state (e.g., a power disturbance event) 622 automatically and without the request 612 of the power quality system if power disturbance is observed. Regardless of how the power quality system 610 receives power disturbance-related data from the two powers 620 and 630 and what such data may include (e.g., different types of power disturbances), the quality system 610 may use the power disturbance profile and power meter topology to output the disturbance determination 614.

Figure 7:
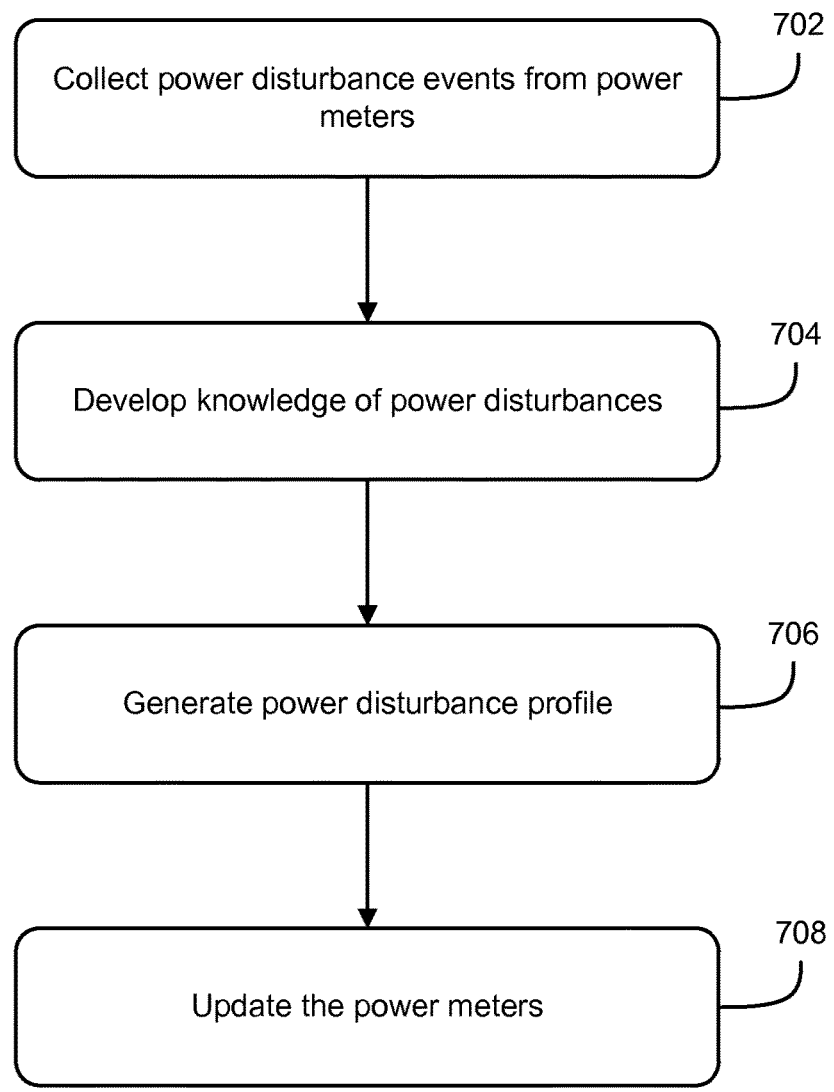
FIG. 7 is an illustrative flowchart for maintaining a power disturbance profile and power meter topology in accordance with embodiments.
Figure 8:
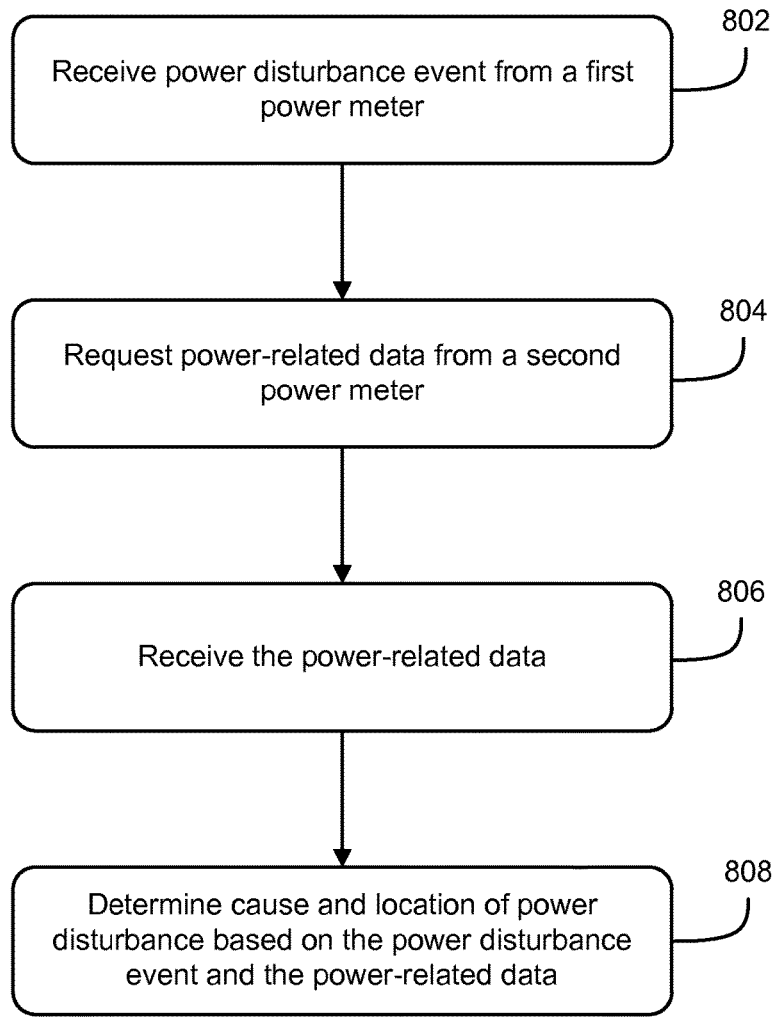
FIG. 8 is an illustrative flowchart for detecting a power disturbance in accordance with embodiments.
Figure 9:
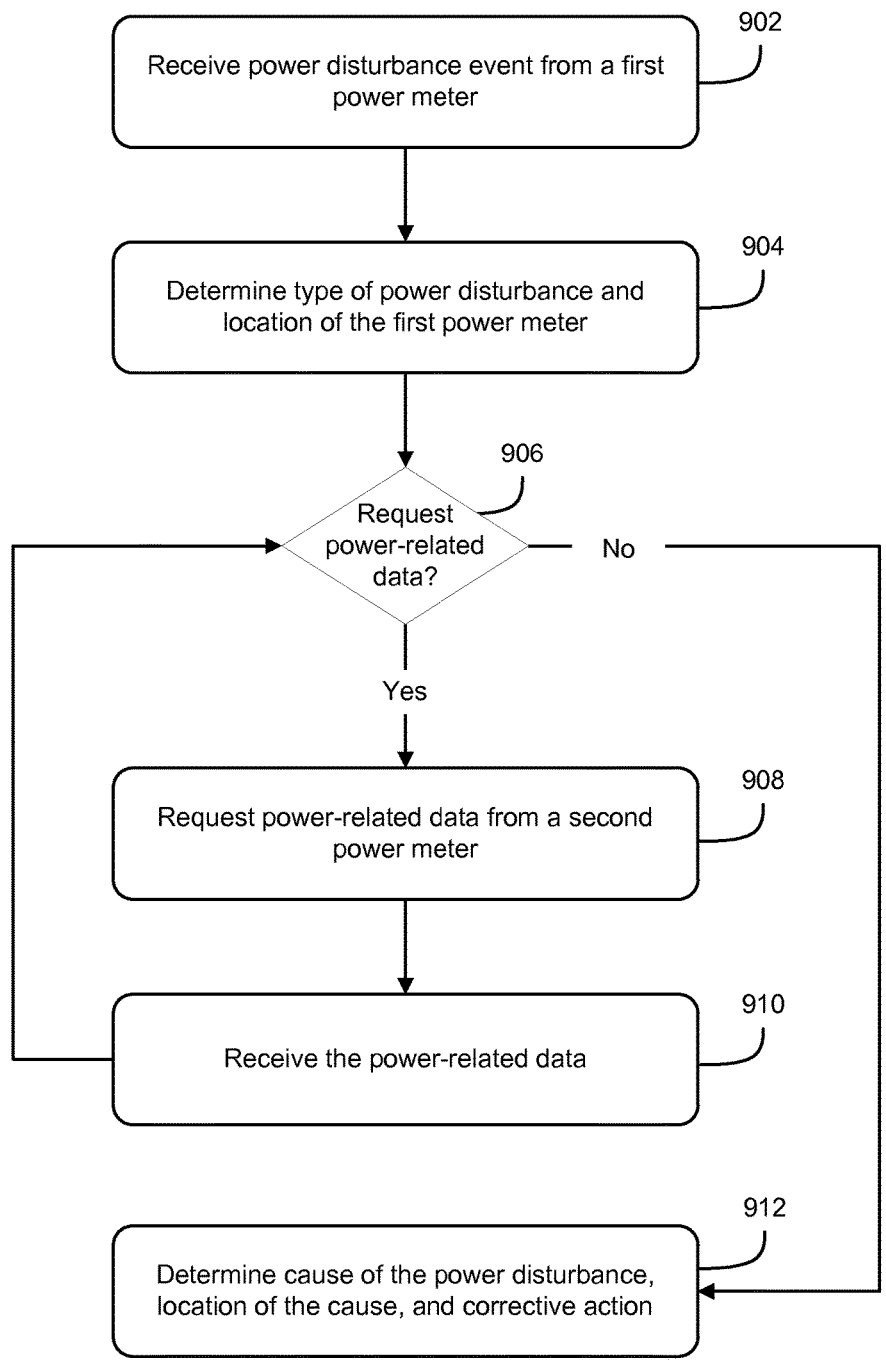
FIG. 9 is another illustrative flowchart for detecting a power disturbance based on multiple power meters in accordance with embodiments.

Turning to FIGS. 7-9, the figures illustrate example flows related to detecting power disturbances. FIG. 7 illustrates an example flow for generating a power disturbance profile. In comparison, FIGS. 8 and 9 illustrate example flows for detecting a power disturbance based on the power disturbance profile. Some of the operations of the example flows of FIGS. 7-9 may be similar. Such similarities are not repeated herein in the interest of clarity of explanation.

Further, in the illustrative operations, some of the operations or functions may be embodied in, and fully or partially automated by, modules executed by one or more processors. In the interest of clarity of explanation, a power quality system and/or a power meter may be described as performing certain operations. Components other than the power quality system and/or the power meter or a combination of such other components may be additionally or alternatively used. Such components may generally be configured to detect power disturbances, capture waveforms of the power disturbances, identify types of disturbances, transmit and receive data over a network, analyze power disturbances, and initiate corrective actions. Also, while the operations are illustrated in a particular order, it should be understood that no particular order is necessary and that one or more operations may be omitted, skipped, and/or reordered.

As illustrated in FIG. 7, the example for generating the power disturbance profile may start at operation 702, where the power quality system may collect power disturbance events from a plurality of power meters. The power disturbance events may include data related to power disturbances such as data power measurements and/or the power disturbance types. For example, when a power meter detects a power disturbance, the power quality system may receive and store a respective power disturbance event from the power meter over a network.

At operation 704, the power quality system may develop knowledge of power disturbances. For example, the power quality system may store the power disturbance events and identifiers of the respective power meters that may have reported such events. The power quality system may also store additional data related to measuring, detecting, and resolving power disturbances, such as locations of such power meters, pings and responses by other power meters to a power disturbance detected at a particular power meter, causes, locations, corrective actions initiated, successes and failures of the corrective actions, and/or reporting history of each power meter (e.g., past power disturbances reported per power meter and resulting causes, locations, and corrective actions).

At operation 706, the power quality system may generate a power disturbance profile. In an example, the power quality system (or some other analysis tool or system interfacing accessible to the power quality system) may analyze the developed knowledge to generate the power disturbance profile. For instance, the data collected over time may be analyzed to determine causes of disturbances, locations of causes, likelihoods of the causes, and/or response logic (e.g., what power meters to ping and criteria to trigger the pings, and corrective actions to initiate). The result of the analysis may form the power disturbance profile.

In an example, the analysis may involve recognizing patterns of power disturbances per disturbance type, location, time period, set of power meters, set of power loads, and/or hierarchy level of the datacenter topology. The analysis may apply a machine learning algorithm, such as one utilizing support vector machines (SVMs) a random forest algorithm, or regression models to recognize the patterns and, accordingly, generate the power disturbance profile.

To illustrate, consider an example of a power distortion. Over time, the power quality system may collect indications of the power distortion from a first power meter and a second power meter. The power quality system may also access reports about corrective actions related to the power distortion. These reports may have been inputted by personnel of the datacenter tasked to perform the corrective actions. In this example, the analysis indicates that, when the power distortion is reported by the first power meter, seventy five percent of the time (or some other percentage) the cause is a particular first power load connected to the first power meter. In this example also, the analysis indicates that for the remaining twenty five percent (or some other percentage), the cause is either the first power load or a second power load connected to the second power meter. Which of the two power loads is the culprit may be accurately determined by comparing power-related data of both meters. If the power distortion is only reported by the first power meter, the first power load may be the cause; otherwise, the second power load may be the cause. In addition, the analysis indicates that a successful corrective action may include adjusting the power settings of the culprit power load. As such, the power quality system may generate or include in the power disturbance profile information from the analysis. For example, the power disturbance profile may indicate that seventy five percent of the time, the first power load may be the cause when the power distortion is reported by the first power meter. The power disturbance profile may also indicate that, to more accurately identify the cause, power-related data of both power meters should be compared. If only the first power meter reports the power distortion, the first power load is very likely the cause; otherwise, the second power meter is very likely the cause. Additionally, the power disturbance profile may recommend that the power settings of the likely cause be adjusted as a corrective action.

At operation 708, the power quality system may update the power meters. For example, the power quality system may transmit a portion or the entire power disturbance profile to each power meter. In turn, a power meter may use the received power distribution profile to identify a power disturbance type and/or initiate a corrective action as applicable. A transmitted portion may be customized to the recipient power meter. For example, if the transmitted portion includes a list of potential corrective actions, that list may be limited to corrective actions that the power meter may be capable of initiating. For instance, the corrective actions may relate to changing power settings of the power meter and/or of an associated power component.

Similarly, the power quality system may update the power loads. For example, the power quality system may transmit a portion or the entire power disturbance profile to each power load or to particular power loads of the datacenter. In turn, a power load may use the received power disturbance profile (or the applicable portion) to manage certain operations of the power load. To illustrate, consider an example where the power disturbance profile indicates potential power distortions during the summer season due to larger than normal cooling of equipment racks (or some other reason). A filter may be available to a power load to remove such power distortions and operate under pseudo-normal conditions. If the power load receives the power disturbance profile (or the portion predicting the summer season's power distortion), the power load may apply the filter in the summer season and avoid applying the filter in the other seasons.

Turning to FIG. 8, the figure illustrates an example flow for determining a cause and a location related to a power disturbance based on multiple power meters. In the interest of clarity of explanation, FIG. 8 illustrates the usage of two power meters. However, a larger number of power meters may be similarly used.

The example flow of FIG. 8 may start at operation 802, where the power quality system may receive a power disturbance event from a first power meter. For example, the first power meter may have observed a power disturbance. Accordingly, the first power meter may send corresponding power measurements or a power disturbance type to the power quality system over a network. In this example, the power disturbance may represent a trigger that may cause the first power meter to send the power disturbance event. Other triggers may be additionally or alternatively used. In an example, a time-based trigger may be used. For instance, the power quality system may periodically or at specific times request the first power meter to send power-related data associated therewith. This power-related data may include the power disturbance event when the power disturbance is observed.

At operation 804, the power quality system may request power-related data from a second power meter. For example, the power quality system may request the second power meter to send its power state. This power state may include an indication of a power disturbance event (or a lack thereof) such as whether the second power meter may have observed a power disturbance or not, and/or the type of an observed power disturbance.

The power quality system may identify the second power meter based on the power disturbance profile (e.g., as generated in the example flow of FIG. 7) and a power meter topology. For example, the power quality system may determine the power disturbance type from the power disturbance event received from the first power meter. The power quality system may input the power disturbance type and an identifier (e.g., an IP address, a serial number, a name) of the first power meter to the power disturbance profile and output therefrom an indication to ping a power meter(s) within a certain hierarchy level(s) and/or within a particular set of power meters corresponding to a particular location should be pinged. The power quality system may identify the second power meter (e.g., determine an IP address) from the power meter topology as a power meter belonging to the hierarchy level and/or the set.

At operation 806, the power quality system may receive the power-related data from the second power meter. For example, the second power meter may respond to the request with the power-related data. Although the example flow of FIG. 8 illustrates that the second power meter may respond to the request of the power quality system, other techniques may be similarly used to send the power-related data of the second power meter to the power quality system. For instance, the second power meter may send the power-related data upon a detection of a disturbance, automatically based on a time interval, or in response to a request from the first power meter.

At operation 808, the power quality system may determine a cause of the power disturbance and a location of the cause based on the disturbance event of the first power meter and the power-related data of the second power meter. For example, the power quality system may generate a first input from the power disturbance event. The first input may identify the power disturbance type and the first power distribution meter. Similarly, the power quality system may generate a second input from the power-related data. The second input may identify whether a power disturbance may have been also observed at the second power meter, the type of this power disturbance if observed, and the second power meter. The power quality system may provide the first and second inputs to the power disturbance profile and accordingly output the cause, the location and, optionally, a corrective action.

Turning to FIG. 9, the figure illustrates another example flow for determining the cause, the location, and the corrective action. The example flow of FIG. 9 may start at operation 902, where the power quality system may receive a power disturbance event from a first power meter. At operation 904, the power quality system may determine a power disturbance type and a location of the first power meter. The power disturbance type may be determined from the power disturbance event. The location of the first power meter may include a logical address, such as an IP address, and may be determined from the data exchange with the first power meter. The location may also include a physical location. Such a physical location may be determined based on a logical-to-physical location mapping stored in the first power meter topology.

At operation 906, the power quality system may determine whether additional power-related data should be requested from other power meters. For example, the power quality system may input the power disturbance type and the location (or some other identifier) of the first power meter to the power disturbance profile. If such data is insufficient to identify the cause and/or the location, the additional power-related data may be requested. Additionally or alternatively, if an outputted cause and/or location are associated with an unacceptable likelihood (e.g., the cause may be a potential cause with a high degree of uncertainty), the additional power-related data may be requested. Whether a likelihood may be acceptable or not may be based on a comparison of the likelihood to a threshold. The threshold may be predefined and/or may depend on the power disturbance type. For instance, some power disturbance types may have a larger impact on the power components relative to other power disturbance types (e.g., a power distortion may more severely impact a particular component than a power swell). In such situation, the threshold may be set to a higher value such that the cause and location may be more accurately determined, thereby causing a more proper corrective action to be initiated.

If the additional power-related data is to be requested, operation 908 may follow operation 906 to request such data. Otherwise, operation 912 may be followed to determine the cause.

At operation 908, the power quality system may request the power related data from a second power meter. The power quality system may identify the second power meter based on the power disturbance profile and the power meter topology. At operation 910, the power quality system may receive the power-related data from the second power meter. The operations 906-910 may be iteratively repeated until a determination is made that no additional power-related data should be requested. This may correspond to having collected sufficient data to accurately determine the cause and the location.

At operation 912, the power quality system may determine the cause, the location, and the corrective action based on the power disturbance type and, as applicable, the additional power-related data and identifiers of the respective power meters. For example, the power quality system may input the power disturbance type and the identifier of the first power meter (determined at operation 904) to the power distribution profile. The power quality system may also input any observed power disturbance types (whether of the same or of a different type as the one observed by the first power meter) or lack thereof and identifiers of the additional power meters (e.g., the second power meter and any other power meter pinged as a result of performing operations 906-910) to the power distribution profile. As an output from the power disturbance profile, the power quality system may identify the cause, the location, and the corrective action.

Figure 10:
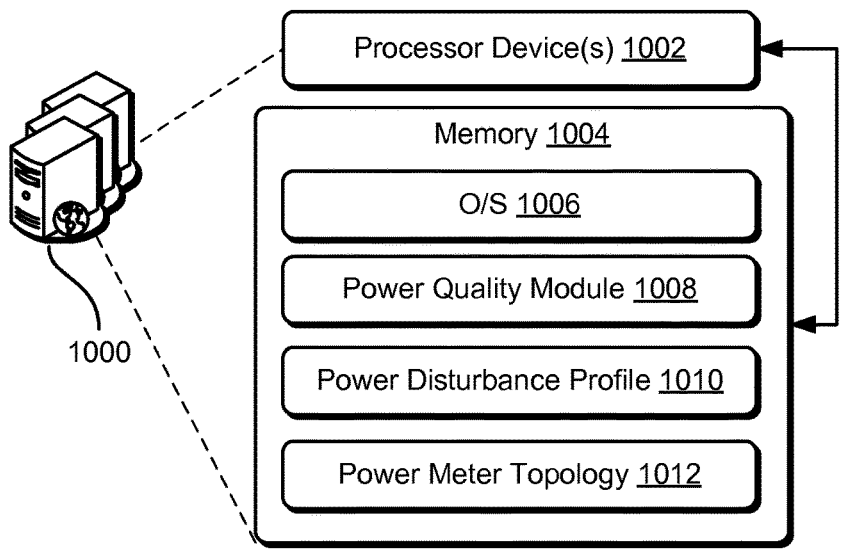
FIG. 10 illustrates an environment in which various embodiments can be implemented.

FIG. 10 illustrates an example architecture for implementing a power quality system. In the illustrated architecture, a set of computing resources 1000 such as one including a server, may host different components to provide the functionalities of the power quality system.

In some aspects, the computing resources 1000 may be any type of computing devices such as, but not limited to, a mobile phone, a smart phone, a personal digital assistant (PDA), a laptop computer, a desktop computer, a server computer, a thin-client device, a tablet PC, etc. Additionally, it should be noted that in some embodiments, the computing resources 1000 may be executed by one or more virtual machines implemented in a hosted computing environment. The hosted computing environment may include one or more rapidly provisioned and released computing resources, which computing resources may include computing, networking and/or storage devices. A hosted computing environment may also be referred to as a cloud computing environment. In some examples, the computing resources 1000 may be in communication with power meters and/or different power components of, for example, a datacenter over a network. The computing resources 1000 may include one or more servers, perhaps arranged in a cluster, as a server farm, or as individual servers not associated with one another. These servers may be configured as part of an integrated, distributed computing environment.

In one illustrative configuration, the computing resources 1000 may include one or more processing units (or processor(s) 1002) and at least one memory 1004. The processor(s) 1002 may be implemented in hardware, computer-executable instructions, firmware, or combinations thereof. Computer-executable instruction or firmware implementations of the processor(s) 1002 may include computer-executable or machine-executable instructions written in any suitable programming language to perform the various functions described.

In some instances, the hardware processor(s) 1002 may be a single core processor or a multi-core processor. A multi-core processor may include multiple processing units within the same processor. In some embodiments, the multi-core processors may share certain resources, such as buses and second or third level of caches. In some instances, each core in a single or multi-core processor may also include multiple executing logical processors (or threads). In such a core (e.g., those with multiple logical processors), several stages of the execution pipeline and also lower level caches may also be shared.

The memory 1004 may store program instructions that are loadable and executable on the processor(s) 1002, as well as data generated during the execution of these programs. Depending on the configuration and type of the computing resources 1000, the memory 1004 may be volatile (such as RAM) and/or non-volatile (such as ROM, flash memory, etc.). The computing resources 1000 or servers may also include additional storage, which may include removable storage and/or non-removable storage. The additional storage may include, but is not limited to, magnetic storage, optical disks, and/or tape storage. The disk drives and their associated computer-readable media may provide non-volatile storage of computer-readable instructions, data structures, program modules, and other data for the computing devices. In some implementations, the memory 1004 may include multiple different types of memory, such as SRAM, DRAM, or ROM.

The memory 1004 and the additional storage, both removable and non-removable, are all examples of computer-readable storage media. For example, computer-readable storage media may include volatile or non-volatile, removable or non-removable media implemented in any method or technology for storage of information such as computer-readable instructions, data structures, program modules, or other data. The memory 1004 and the additional storage are all examples of computer storage media. Additional types of computer storage media that may be present in the computing resources 1000 may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, or any other medium which can be used to store the desired information and which can be accessed by the computing resources 1000. Combinations of any of the above should also be included within the scope of computer-readable media.

Alternatively, computer-readable communication media may include computer-readable instructions, program modules or other data transmitted within a data signal, such as a carrier wave or other transmission. However, as used herein, computer-readable storage media does not include computer-readable communication media.

The computing resources 1000 may also contain communications connection(s) that allow the computing resources 1000 to communicate with power meters, power components, a stored database, another computing device or server, user terminals and/or other devices on over one or more networks. The computing resources 1000 may also include I/O device(s), such as a keyboard, a mouse, a pen, a voice input device, a touch input device, a display, speakers, a printer, and the like. The communication connection(s) and the I/O device(s), along with the storage, may be described as peripheral devices.

The memory 1004 may include an operating system 1006, one or more data stores, and/or one or more application programs or services for implementing the features disclosed herein. Turning to the contents of the memory 1004, the memory 1004 may include a power quality module 1008, a power disturbance profile 1010, and a power meter topology 1012. The power quality module 1008 may be configured to analyze power-related data based on interactions with power meters and with the power disturbance profile 1010 and the power meter topology 1012 to determine causes, locations, and corrective actions related to power disturbances.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 10, and/or functions described herein can be provided by one or more modules that exist as separate modules and/or module functions described herein can be spread over multiple modules.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
receiving, over a network, by a computer system configured to determine power quality within a datacenter, an indication of a power disturbance associated with the datacenter from a first power meter of the datacenter, the first power meter having a first logical address on the network and a first physical location in the datacenter, the indication received in a data communication from the first power meter based on the first logical address;
determining, by the computer system, a type of the power disturbance based on the indication;
accessing, by the computer system, a power disturbance profile and a power meter topology of the datacenter based on the type of the power disturbance;
determining that power-related data should be requested from a second power meter of the datacenter based on the power disturbance profile;
identifying a second logical address of the second power meter from the power meter topology based on the first logical address and the first physical location of the first power meter;
transmitting, by the computer system, a request for the power-related data to the second power meter over the network based on the second logical address;
receiving, by the computer system, a response to the request from the second power meter over the network, the response to the request received in a data communication from the second power meter based on the second logical address; and
identifying, by the computer system, a cause of the power disturbance and a location of the cause based on the power disturbance profile, the indication of the power disturbance from the first power meter, and the response from the second power meter.

2. The computer-implemented method of claim 1, wherein the cause comprises at least one of: a power load of the datacenter, distribution from a utility supplying power to the datacenter, or an environmental cause, and wherein the type of the power disturbance comprises at least one of: a power transient, a power interruption, a power sag, a power swell, or a power distortion.

3. The computer-implemented method of claim 1, wherein the power disturbance profile comprises potential causes of power disturbances within the datacenter, potential locations of the potential causes, and corrective actions associated with the potential causes and the potential locations, and wherein the power disturbance profile is generated based on historical data received from power meters of the datacenter, wherein the historical data comprises at least one of: historical power disturbances detected at the first power meter, historical responses of the second power meter to historical power disturbances detected at the first power meter, historical causes and historical locations of the historical power disturbances, corrective actions initiated in response to the historical causes, or successes and failures of the corrective actions.

4. The computer-implemented method of claim 1, wherein the power meter topology comprises a first location of the first power meter within a first hierarchy level of the datacenter and a second location of the second power meter within a second hierarchy level of the datacenter, and wherein accessing the power disturbance profile and the power meter topology comprises:
  determining that the power-related data should be requested from a power meter located within the second hierarchy level of the datacenter based on the power disturbance profile; and
  identifying the second power meter as belonging to the second hierarchy level based on the power meter topology.

5. The computer-implemented method of claim 1, further comprising:
  initiating, by the computer system, a corrective action based on the cause and the location of the cause, the corrective action specified in the power disturbance profile and comprising a specified adjustment to a power setting associated with a measurement by the first power meter.

6. The computer-implemented method of claim 5, wherein:
  the power disturbance profile associates the type of the power disturbance, a cause of the power disturbance, and a location of the cause,
  the power disturbance profile also specifies a response to the indication of the power disturbance from the first power meter,
  the power meter topology associates the first logical address and the first physical location and comprises a hierarchy of power meters of the datacenter, the hierarchy defined based on physical locations of the power meters,
  the determining that the power-related data should be requested is based on the response from the power disturbance profile, and
  the second logical address is identified further based on the hierarchy from the power meter topology.

7. The computer-implemented method of claim 1, further comprising:
  adjusting a power setting of the first power meter based on the cause or the location.

8. The computer-implemented method of claim 1, further comprising:
  generating instructions about adjusting a power setting of a power load connected to the first power meter based on the cause or the location.

9. A system for determining power quality within a datacenter, comprising:
  one or more processors; and
  one or more non-transitory computer-readable storage media storing instructions that, upon execution by the one or more processors, cause the system to:
    receive, over a network, an indication of a power disturbance associated with the datacenter from a first power meter of the datacenter, the first power meter having a first logical address on the network and a first physical location in the datacenter, the indication received in a data communication from the first power meter based on the first logical address;
    determine a type of the power disturbance based on the indication;
    access a power disturbance profile and a power meter topology of the datacenter based on the type of the power disturbance;
    determine that power-related data should be requested from a second power meter of the datacenter based on the power disturbance profile;
    identify a second logical address of the second power meter from the power meter topology based on the first logical address and the first physical location of the first power meter;
    transmit a request for the power-related data to the second power meter over the network based on the second logical address;
    receive a response to the request from the second power meter over the network, the response to the request received in a data communication from the second power meter based on the second logical address; and
    identify a cause of the power disturbance and a location of the cause based on the power disturbance profile, the indication of the power disturbance from the first power meter, and the response from the second power meter.

10. The system of claim 9, wherein the cause comprises at least one of: a power load of the datacenter, distribution from a utility supplying power to the datacenter, or an environmental cause, and wherein the type of the power disturbance comprises at least one of: a power transient, a power interruption, a power sag, a power swell, or a power distortion.

11. The system of claim 9, wherein:
  the power disturbance profile comprises potential causes of power disturbances within the datacenter, potential locations of the potential causes, and corrective actions associated with the potential causes and the potential locations, and
  the power disturbance profile is generated based on historical data received from power meters of the datacenter, wherein the historical data comprises at least one of: historical power disturbances detected at the first power meter, historical responses of the second power meter to historical power disturbances detected at the first power meter, historical causes and historical locations of the historical power disturbances, corrective actions initiated in response to the historical causes, or successes and failures of the corrective actions.

12. The system of claim 9, wherein the power meter topology comprises a first location of the first power meter within a first hierarchy level of the datacenter and a second location of the second power meter within a second hierarchy level of the datacenter, and wherein accessing the power disturbance profile and the power meter topology comprises:
  determining that the power-related data should be requested from a power meter located within the second hierarchy level of the datacenter based on the power disturbance profile; and
  identifying the second power meter as belonging to the second hierarchy level based on the power meter topology.

13. The system of claim 9, wherein the execution of the instructions further causes the system to:
  initiate a corrective action based on the cause and the location of the cause, the corrective action specified in the power disturbance profile and comprising a specified adjustment to a power setting associated with a measurement by the first power meter.

14. The system of claim 13, wherein:

the power disturbance profile associates the type of the power disturbance, a cause of the power disturbance, and a location of the cause, the power disturbance profile also specifies a response to the indication of the power disturbance from the first power meter, the power meter topology associates the first logical address and the first physical location and comprises a hierarchy of power meters of the datacenter, the hierarchy defined based on physical locations of the power meters, the determining that the power-related data should be requested is based on the response from the power disturbance profile, and the second logical address is identified further based on the hierarchy from the power meter topology.

15. The system of claim 9, wherein the execution of the instructions further causes the system to:

adjust a power setting of the first power meter based on the cause or the location.

16. The system of claim 9, wherein the execution of the instructions further causes the system to:

generate instructions about adjusting a power setting of a power load connected to the first power meter based on the cause or the location.

17. One or more non-transitory computer-readable storage media storing instructions that, upon execution on a system, cause the system to perform operations comprising:

receiving, over a network, an indication of a power disturbance associated with a datacenter from a first power meter of the datacenter, the first power meter having a first logical address on the network and a first physical location in the datacenter, the indication received in a data communication from the first power meter based on the first logical address;

determining a type of the power disturbance based on the indication;

accessing a power disturbance profile and a power meter topology of the datacenter based on the type of the power disturbance;

determining that power-related data should be requested from a second power meter of the datacenter based on the power disturbance profile;

identifying a second logical address of the second power meter from the power meter topology based on the first logical address and the first physical location of the first power meter;

transmitting a request for the power-related data to the second power meter over the network based on the second logical address;

receiving a response to the request from the second power meter over the network, the response to the request received in a data communication from the second power meter based on the second logical address; and identifying a cause of the power disturbance and a location of the cause based on the power disturbance profile, the indication of the power disturbance from the first power meter, and the response from the second power meter.

18. The one or more non-transitory computer-readable storage media of claim 17, wherein the cause comprises at least one of: a power load of the datacenter, distribution from a utility supplying power to the datacenter, or an environmental cause, and wherein the type of the power disturbance comprises at least one of: a power transient, a power interruption, a power sag, a power swell, or a power distortion.

19. The one or more non-transitory computer-readable storage media of claim 17, wherein:

the power disturbance profile comprises potential causes of power disturbances within the datacenter, potential locations of the potential causes, and corrective actions associated with the potential causes and the potential locations, and the power disturbance profile is generated based on historical data received from power meters of the datacenter, wherein the historical data comprises at least one of: historical power disturbances detected at the first power meter, historical responses of the second power meter to historical power disturbances detected at the first power meter, historical causes and historical locations of the historical power disturbances, corrective actions initiated in response to the historical causes, or successes and failures of the corrective actions.

* * * * *